United States Patent [19]
Yamamoto

[11] Patent Number: 5,930,672
[45] Date of Patent: Jul. 27, 1999

[54] MANUFACTURE OF SEMICONDUCTOR DEVICE HAVING RELIABLE AND FINE CONNECTION HOLE

[75] Inventor: Hiromitsu Yamamoto, Hamamatsu, Japan

[73] Assignee: Yamaha Corporation, Japan

[21] Appl. No.: 08/857,207

[22] Filed: May 15, 1997

[30] Foreign Application Priority Data

May 20, 1996 [JP] Japan .................................. 8-148658

[51] Int. Cl.⁶ .............................................. H01L 21/4763
[52] U.S. Cl. ........................ 438/637; 438/638; 438/640; 438/527; 438/533
[58] Field of Search .................................. 438/637, 638, 438/639, 640, 533, 527

Primary Examiner—Peter Toby Brown
Assistant Examiner—Khanh Duong

[57] ABSTRACT

A resist pattern (dummy pattern) is formed on the surface of a substrate which pattern has a shape corresponding to a desired connection hole, and thereafter an insulating film such as SOG is formed covering the resist pattern. The insulating film is etched back until the resist pattern is exposed and thereafter the resist pattern is removed by ashing or dissolving. With the above processes, a connection hole corresponding the resist pattern can be obtained. As a layer for forming the dummy pattern, an SiN or polysilicon layer may be used instead of a resist layer. The substrate may have wiring patterns formed thereon via an insulating film or may not have wiring patterns. A fine connection hole having a high aspect ratio can be formed.

7 Claims, 7 Drawing Sheets

MANUFACTURE OF SEMICONDUCTOR DEVICE HAVING RELIABLE AND FINE CONNECTION HOLE

This application is based on Japanese Patent Application HEI 8148658, filed on May 20, 1996, the whole contents of which are incorporated herein by reference.

BACKGROUND OF THE INVENTION a) Field of the Invention

The present invention relates to manufacture of semiconductor devices such as LSI, and more particularly to a method of manufacturing a semiconductor device capable of easily forming a fine connection hole having a high aspect ratio (a hole having a depth larger than a hole diameter).

b) Description of the Related Art

A method as illustrated in FIGS. 19 to 21 is known to form a connection hole during manufacture of LSI.

In the process illustrated in FIG. 19, a resist layer 3 is formed on an insulating film 2, such as silicon oxide, which covers the surface of a substrate 1. Holes 3a and 3b with a desired connection hole pattern are formed in the resist layer 3 by well-known exposure and development processes.

Next, in the process illustrated in FIG. 20, connection holes 2a and 2b corresponding to the holes 3a and 3b using the resist layer 3 as an etching mask. This selective etching process may be performed by a single process of anisotropic dry etching. However, if isotropic wet or dry etching is first performed and then anisotropic dry etching is performed, the connection hole 2a, 2b can be formed whose step at the opening thereof can be alleviated as shown in FIG. 20. The resist layer 3 is removed after etching.

Thereafter, in the process illustrated in FIG. 21, wiring material such as Al is deposited on the upper surface of the substrate. This deposited layer is patterned by well-known photolithography and selective etching to form wiring layers 4A and 4B filling the connection holes 2a and 2b.

The substrate 1 may be or may not be preliminarily provided with interconnections formed on the substrate surface via an insulating layer. If the substrate surface is formed with interconnections, the wiring layers 4A and 4B are usually connected to the interconnections on the substrate surface, whereas if the substrate surface is not formed with interconnections, the wiring layers 4A and 4B are usually connected to impurity doped regions in the substrate surface layer.

Since the step at the opening of the connection hole 2a, 2b is alleviated as shown in FIG. 20, the step coverage of the wiring layers 4A and 4B can be improved as shown in FIG. 21.

With the above-described conventional method, the insulating film is selectively dry etched by using the resist layer as the mask to form connection holes. Therefore, as the aspect ratio (ratio of hole depth to hole diameter) of a connection hole becomes large, it becomes difficult to supply etchant ions to the bottom of a connection hole with finely controlled directivity.

Further, if isotropic wet or dry etching is performed for alleviating the step at an opening of a connection hole, the number of manufacture steps increases.

Still further, if connection holes 2a and 2b are formed on impurity doped regions in the substrate surface layer, plasma etchant reaches via the connection holes the surfaces of impurity doped regions. Therefore, damage layers with crystal defects or the like may be formed, or excessive etching and deposition of by-product may occur. In this case, annealing for relieving damages or dry etching for removing the damage layer is performed, increasing the number of manufacture steps.

SUMMARY OF THE INVENTION

It is an object of the present invention to provide a method of manufacturing a semiconductor device capable of simply forming a fine connection hole having a high aspect ratio.

According to one aspect of the present invention, there is provided a method of manufacturing a semiconductor device comprising the steps of: forming a dummy pattern on a substrate, the dummy pattern having a shape corresponding to a desired connection hole; forming an insulating film over the substrate, the insulating film covering the dummy pattern; removing a surface region of the insulating film until an upper surface of the dummy pattern is exposed; and removing the dummy pattern after the step of removing the surface region to form a connection hole corresponding to the dummy pattern through the insulating film.

The step of removing the surface region of the insulating film may be an etch-back process, a chemical mechanical polishing (CMP) process, or the like.

With this method, after a dummy pattern is formed on a substrate, which dummy pattern has a shape corresponding to a desired connection hole, an insulating film is formed over the substrate which film covers the dummy pattern, and the surface region of the insulating film is removed and the dummy pattern is removed to form the connection hole. Accordingly, a difficult hole forming process by dry etching is not necessary and a fine connection hole having a high aspect ratio can be formed with ease. Furthermore, a damage layer is not formed on the substrate surface because plasma etchant is not used.

With this semiconductor device manufacture method, the dummy pattern forming step may form a dummy pattern thinning from the upper portion toward the lower portion thereof so that the connection hole forming step forms a connection hole having a larger size of the upper portion than the lower portion, e.g. diverging upwardly. Forming the dummy pattern made of resist or the like and thinning from the upper portion toward the lower portion can be easily realized by using negative resist or the like. Accordingly, a connection hole with a larger size of the upper portion than the lower portion can be obtained easily. Thereby, the step coverage of a wiring to be formed thereafter at its opening can be alleviated.

The connection hole is formed by removing the dummy pattern having a shape corresponding to a desired connection hole after the formation of the insulating film and the removal of its surface region. Accordingly, a fine connection hole with a high aspect ratio can be formed easily without a difficult hole forming process of dry etching, and a yield of forming a contact hole can be improved.

If this method is applied to the formation of a connection hole to be directly led to an impurity doped region in the substrate surface layer, a hole forming process of dry etching is not necessary so that it is possible to avoid damages such as crystal detects, excessive etching, deposition of by-products, and the like to be otherwise caused by plasma etchant.

Furthermore, if the dummy pattern is formed thinning from the upper portion toward the lower portion, a step at the opening of the connection hole can be easily alleviated and the step coverage of the wiring pattern can be improved.

DETAILED DESCRIPTION OF THE PREFERRED EMBODIMENTS

FIGS. 1 to 6 illustrate a method of forming a connection hole according to an embodiment of the invention. The processes (1) to (6) will be described in this order, corresponding to FIGS. 1 to 6.

Process (1)

Figure 1:
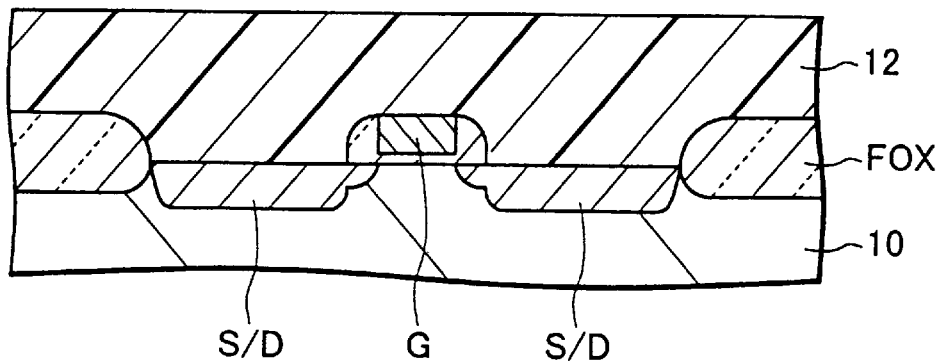
FIGS. 1 to 6 are cross sectional views of a substrate illustrating a method of forming a connection hole according to an embodiment of the invention, wherein FIGS. 1 to 6 respectively correspond to a resist layer forming process, a resist developing process, an insulating film forming process, an etch-back process, a resist removing process, and a wiring forming process.

As shown in FIG. 1, a resist layer 12 is coated on the surface of a substrate 10 by well-known spin coating. For example, the resist layer 12 is made of novolak-based positive resist and has a thickness of about 1 to 2 $\mu$m. The substrate 10 may be an Si substrate not having interconnections but having only impurity doped regions in the substrate surface layer, or may be an Si substrate having interconnections formed via an insulating film on the substrate surface.

For example, the substrate 10 having the structure shown in FIG. 1 is used. This structure is formed in the following manner. A nitride film pattern is formed on a buffer oxide film which is formed on the surface of the substrate 10. Thereafter a field oxide film FOX is formed by well-known local oxidation of silicon (LOCOS). Thereafter, a gate oxide film is formed by thermal oxidation of a surface of the active region surrounded by the field oxide film FOX. Formed on the gate oxide film is a lamination of a polysilicon layer and a silicide layer. This lamination is patterned by using photolithography to form a gate electrode G. Impurity ions are implanted lightly and shallowly to form lightly doped regions. Then, spacer oxide films are formed on the side walls of the gate electrode G. Then, impurity ions are heavily and deeply implanted to form heavily doped source/drain regions S/D of an LDD structure.

Process (2)

Figure 2:
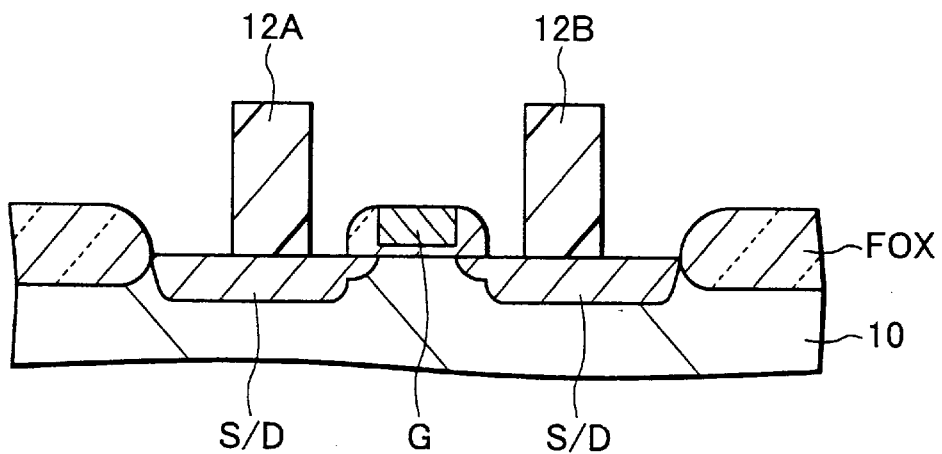

As shown in FIG. 2, the resist layer 12 is subject to well-known exposure and development processes to leave resist patterns (dummy patterns) 12A and 12B (parts of the resist layer 12) having shapes corresponding to a desired connection hole. For example, each resist pattern 12A, 12B has an aspect ratio of about 1 to 2 with a diameter of about 1 $\mu$m or smaller and a height of about 1 to 2 $\mu$m. The resist patterns 12A and 12B are formed to have side walls generally vertical to the substrate surface. The resist patterns 12A and 12B are thereafter subjected to a curing process such as far ultraviolet ray radiation and baking. For example, exposure light has a wavelength of 220 to 320 nm and is emitted from a mercury lamp. For example, baking is performed for about 1 to 2 minutes at a temperature of 100 to 200° C. Here, backing is done, preferably at 120° C. or higher (up to 200° C.). Baking improves heat resistance of the resist pattern. This curing process prevents deformation of the resist patterns 12A and 12B at the next SOG (spin-on-glass) coating process. If SOG is coated after the resist patterns are baked at a temperature of 100 to 120° C. and thereafter baking for curing SOG is performed at 150° C. with a hot plate, the resist pattern may be softened and melted to deform the resist pattern shapes. However, if baking is performed in the temperature range of 120° C. to 200° C., deformation of the resist patterns can be prevented.

Process (3)

Figure 3:
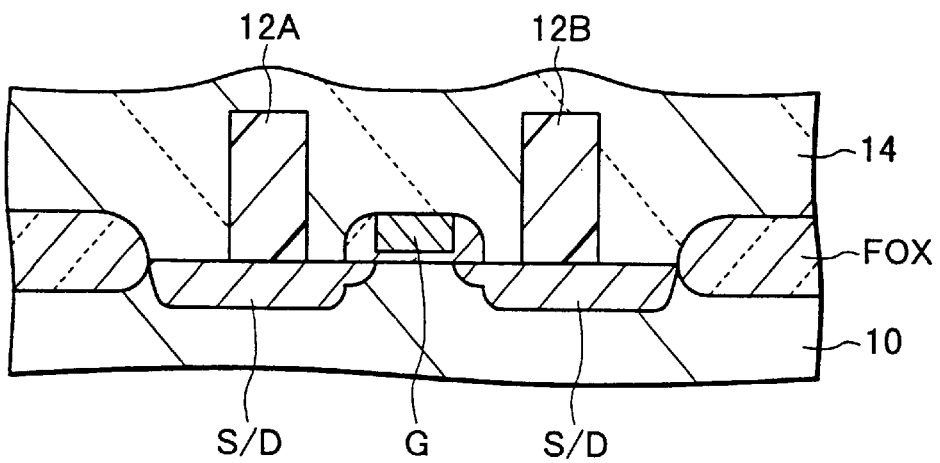

As shown in FIG. 3, SOG is coated on the surface of the substrate 10 by spin coating or the like, covering the resist patterns 12A and 12B, and thereafter hot plate baking is performed at a temperature of, for example, 150 to 200° C. to thereby form an SOG insulating film 14. Instead of SOG, hydrogen silsesquioxane resin or the like may be used.

Process (4)

Figure 4:
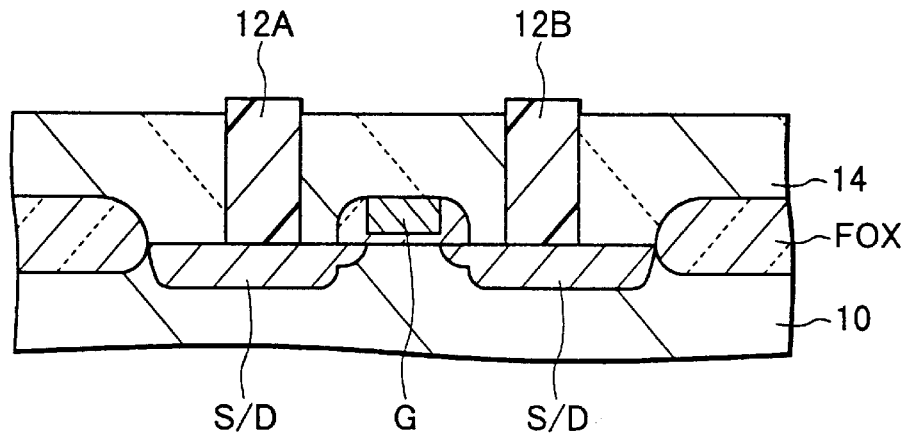

As shown in FIG. 4, the insulating film 14 is etched back until the upper surfaces of the resist patterns 12A and 11B are exposed. For example, the etch-back conditions are:

| | |
|---|---|
| Gas flow | $CHF_3/CF_4/He = 20/20/90$ sccm |
| Pressure | 260 Pa |
| RF power | 275 W |

Process (5)

Figure 5:
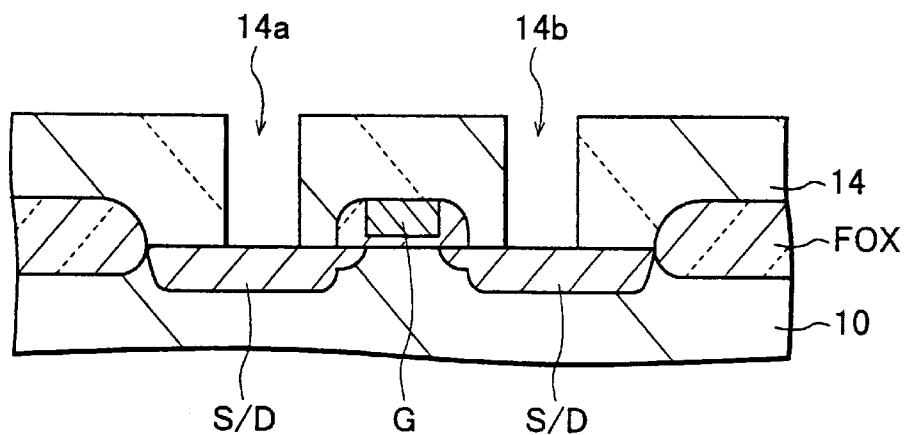

As shown in FIG. 5, the resist patterns 12A and 12B are removed by ashing. As a result, connection holes 14a and 14b corresponding to the resist patterns 12A and 12B are formed through the insulating layer 14. For example, the ashing conditions are:

| | |
|---|---|
| Gas flow | $O_2 = 1000$ sccm |
| Pressure | 800 mTorr |
| RF power | 800 W |

Since the connection holes having the shapes corresponding to the resist pattern shapes are transferred beforehand in the interlayer insulating film, the process of removing (ashing) the resist patterns may be performed either isotropically or anisotropically. It is therefore unnecessary to control a directional supply of etchant gas so as to form vertical walls in an interlayer insulating film. Moreover, since a simple process of removing only the resist patterns is performed, it is not necessary to control the etching conditions by taking microloading effects into consideration, the microloading effects changing an etching rate depending upon the density of resist pattern used for forming a connection hole.

Instead of the ashing process, the following process (a) or (b) may be used for removing the resist patterns 12A and 12B.

(a) An acid remover process: the substrate is dipped in a mixed solution of $H_2SO_4/H_2O_2$ at 140° C. to remove the resist patterns 12A and 12B.

(b) An organic remover process: Organic remover liquid is sprayed to remove the resist patterns 12A and 12B.

After the connection holes 14a and 14b are formed, the insulating film 14 is annealed at about 400° C.

Process (6)

Figure 6:
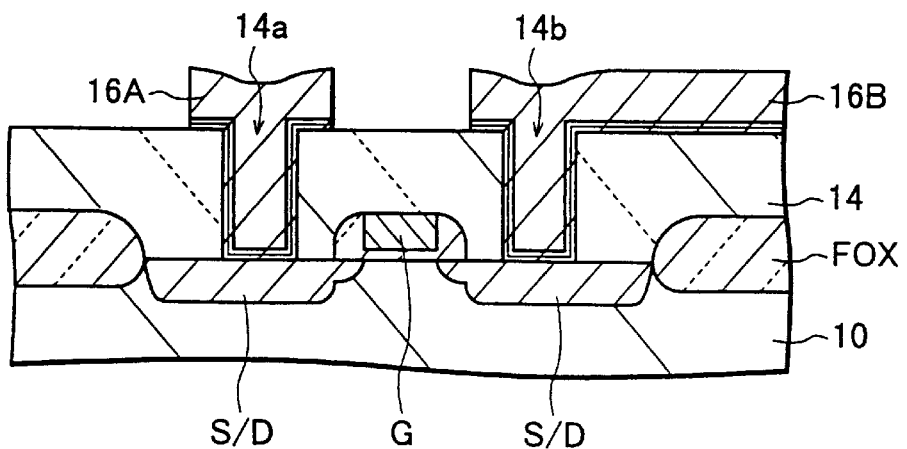

As shown in FIG. 6, on the surfaces of the insulating film 14 and connection holes 14a and 14b, a Ti layer is first formed by sputtering and then a TiN layer is formed by reactive sputtering. Wiring material such as Al and Al alloy is deposited on the TiN/Ti lamination. Al alloy may be Al—Si—Cu, Al—Si, or Al—Cu. The Al/TiN/Ti lamination is then patterned by photolithography and selective etching to form wiring patterns 16A and 16B filling the connection holes 14a and 14b. After the barrier conductive layer is formed and before the wiring material is deposited, conductive material such as tungsten may be filled in the connection holes 14a and 14b. After the wiring material is deposited, a reflow process may be performed to improve the connection hole filling performance.

If impurity doped regions exist just under the insulating film 14, the wiring patterns 16A and 16B are connected to these impurity doped regions, whereas if wiring patterns exist just under the insulating film 14, the wiring patterns 16A and 16B are connected to these underlying wiring patterns. If the wiring patterns 16A and 16B are connected to the impurity doped regions just under the insulating film 14, this insulating film 14 functions as an underlying layer for the wiring pattern, whereas if the wiring patterns 16A and 16B are connected to the underlying wiring patterns just under the insulating film 14, this insulating film 14 functions as an interlayer insulating film electrically separating the upper and lower level wiring patterns.

According to this embodiment illustrated in FIGS. 1 to 6, the connection holes 14a and 14b can be formed through the insulating film 14, which holes reflect the shape and size of the resist patterns 12A and 12B with high fidelity. Fine processing technology of photolithography using resist has recently progressed considerably. This technology can be used for forming a connection hole so that a fine connection hole with a high aspect ratio can be formed easily.

Furthermore, since dry etching is not necessary for the formation of a connection hole, it is not necessary to take into consideration a difference between etching rates. Accordingly, a connection hole can be formed with high fidelity, which has the same size and shape as determined by photolithography. The controllability of the size and shape is excellent.

Still further, since dry etching is not necessary for the formation of a connection hole, it is possible to prevent a manufacture yield from being lowered by deposition of particles during dry etching. Even in the case wherein the connection holes 14a and 14b are used for the impurity doped regions in the substrate surface layer, there can be no damage of the substrate because dry etching by plasma may not be used. It is therefore unnecessary to remove a damaged layer or to perform a damage relieving process. Thereby, the manufacture processes can be simplified.

FIGS. 7 to 12 illustrate a connection hole forming method according to another embodiment of the invention. Although there is no limitative meaning, a substrate 10 is assumed to be covered with an insulating film and a wiring pattern W is exposed partially in the insulating film.

Figure 7:
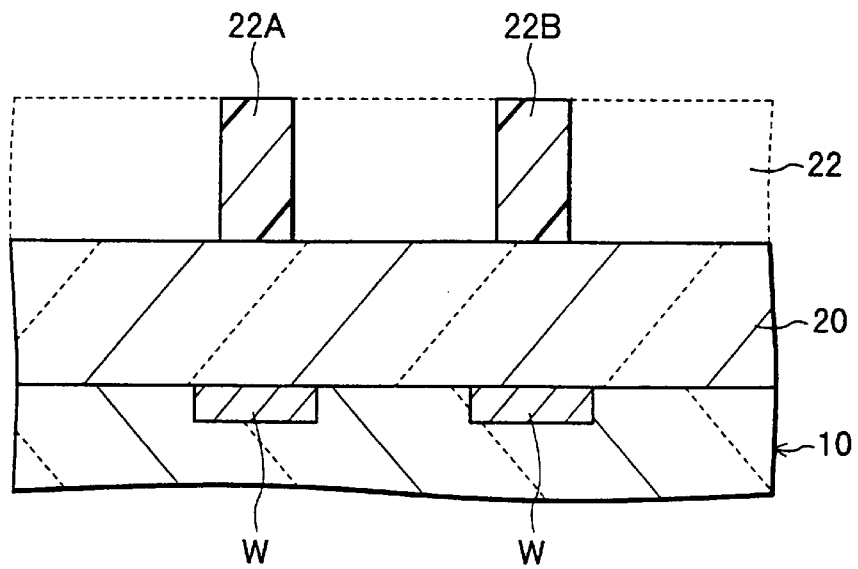
FIGS. 7 to 12 are cross sectional views of a substrate illustrating a method of forming a connection hole according to another embodiment of the invention, wherein FIGS. 7 to 12 respectively correspond to a resist developing process, an SiN or polysilicon layer patterning process, an interlayer insulating film forming process, an etch-back process, an SiN or polysilicon removing process, and a wiring forming process.

In the process illustrated in FIG. 7, an SIN (silicon nitride) or polysilicon layer 20 is formed on the surface of the substrate 10 by chemical vapor deposition (CVD). A resist layer 22 is formed on the SiN or polysilicon layer 20 in the same manner as described with FIG. 1. The resist layer 22 is subjected to exposure and development processes to leave resist patterns 22A and 22B (parts of the resist layer 12) having shapes corresponding to a desired connection hole pattern.

Figure 8:
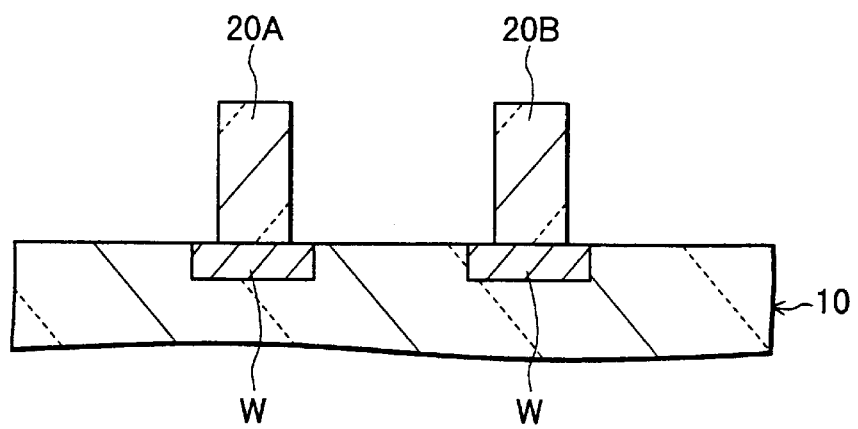

In the process illustrated in FIG. 8, by using the resist patterns 22A and 22B as a mask, the SiN or polysilicon layer 20 is dry etched to leave SIN or polysilicon patterns (dummy patterns) 20A and 20B (parts of the SIN or polysilicon layer 20) having the shapes corresponding to the connection hole pattern. For example, the dry etching conditions for SiN are:

| Gas flow | $SF_6$/He = 15/65 sccm |
|---|---|
| Pressure | 0.2 Torr |
| RF power | 300 W | and the dry etching conditions for polysilicon are

| Gas flow | $SF_6$/flon-32/$Cl_2$ = 4/25/80 sccm |
|---|---|
| Pressure | 10 mTorr |
| RF power | 30 W |

Figure 9:
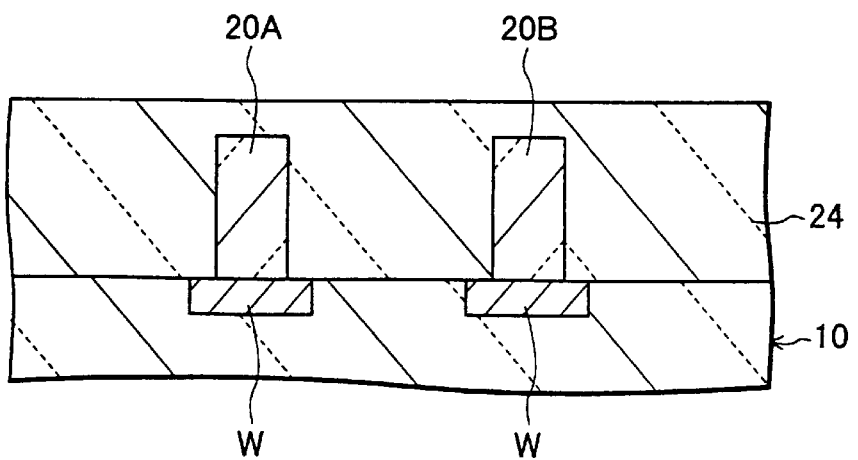

In the process illustrated in FIG. 9, an interlayer insulating film 24 is formed on the surface of the substrate 10, covering the SiN or polysilicon patterns 20A and 20B. For example, this insulating film 24 is formed by the following processes. Namely, a silicon oxide ($SiO_2$) film is deposited as the lowest layer to a thickness of 550 nm by plasma CVD, and thereafter an SOG film is deposited to a thickness of 560 nm on the lowest silicon oxide film. The substrate is etched back from the surface of the SOG film by 630 nm to planarize the surface of the substrate. On this planarized surface, a silicon oxide ($SiO_2$) film is deposited to a thickness of 500 nm by plasma CVD. If appropriate, the planarizing process including the SOG film formation and etch-back may be omitted.

Figure 10:
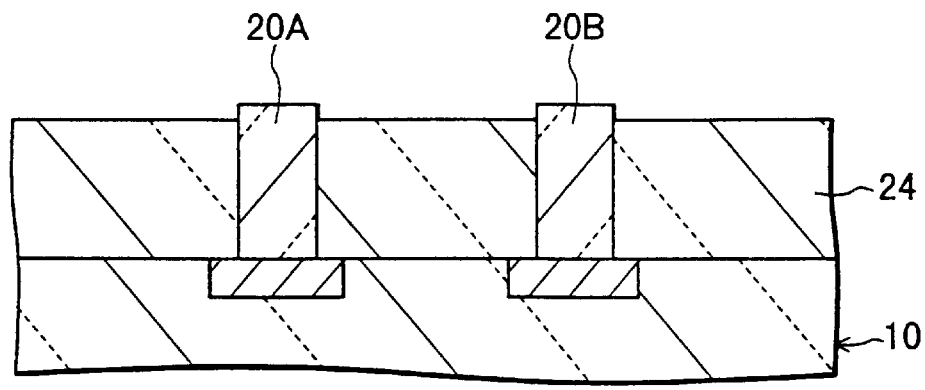

In the process illustrated in FIG. 10, the insulating film 24 is reduced in thickness by etch-back or CMP until the upper surfaces of the SiN or polysilicon patterns 20A and 20B is exposed. Over etching can also be made. The etch-back conditions may be the same as those of SOG described with FIG. 4.

Figure 11:
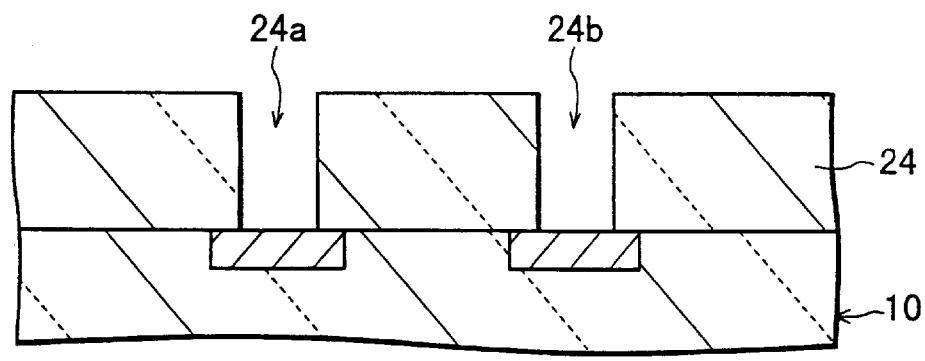

In the process illustrated in FIG. 11, the SiN or polysilicon patterns 20A and 20B are removed. As a result, connection holes corresponding to these patterns 20A and 20B are formed through the insulating film 24. If the patterns 20A and 20B are made of SiN, these patterns can be removed by dipping the substrate in hot phosphoric acid ($H_3PO_4$) solution heated to 160° C. If the patterns 20A and 20B are made of polysilicon, these patterns can be removed by dry etching under the same conditions as the dry etching of polysilicon described with FIG. 8. Instead of dry etching, polysilicon may be removed by chemical solution. Both SiN and polysilicon can be removed with a high etching ratio relative to the insulating film 24.

Figure 12:
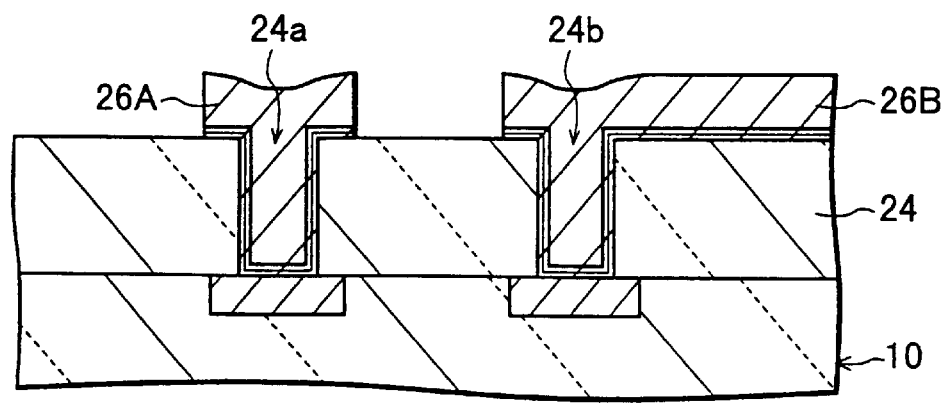

In the process illustrated in FIG. 12, similar to the process described with FIG. 6, wiring patterns 26A and 26B are formed on the insulating film 24, filling the connection holes 24a and 24b. The wiring patterns 26A and 26B are connected to the lower wiring patterns W via the connection holes 24a and 24b, in the manner similar to that described with FIG. 6.

In this embodiment illustrated in FIGS. 7 to 12, elimination of dry etching can be done for the formation of a connection hole. It is therefore easy to form fine connection holes having a high aspect ratio. Further, since there may be no damage by dry etching, the damage relieving process or a damage layer removal may be unnecessary.

Still further, since SiN or polysilicon is used as dummy patterns, the interlayer insulating film 24 of silicon oxide or the like can be formed by plasma CVD, atmospheric pressure CVD, or the like at a higher temperature than using the resist patterns as the dummy patterns. Therefore, high reliability can be attained. More specifically, if resist is used as dummy patterns, an interlayer insulating film of SOG or the like is used which is formed at a low temperature which the resist can endure. If the interlayer insulating film is made of only SOG, the electrical characteristics of transistors formed under the interlayer insulating film may be degraded because SOG contains a large amount of water or moisture contents. If a silicon oxide film formed by plasma CVD is formed under the SOG film as in the case of this embodiment, the transistor characteristics can be prevented from being degraded. The processes illustrated in FIGS. 7 to 12 may be applied to connecting the wiring patterns 26A and 26B to impurity doped regions formed in the substrate surface layer. In this case, the insulating film 24 is used as the underlying layer for the wiring layer.

Figure 13:
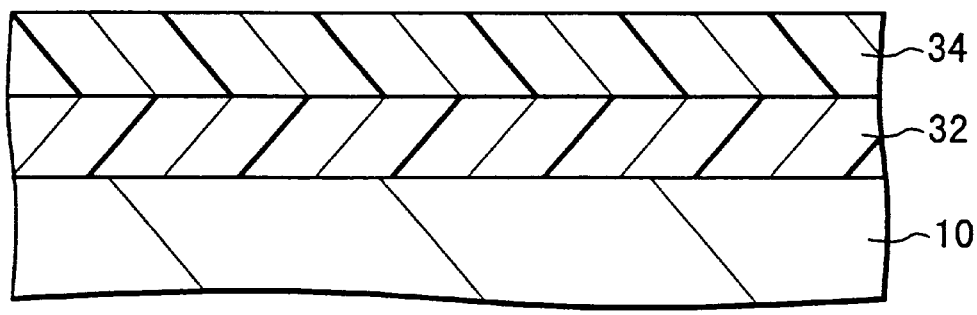
FIGS. 13 to 15 are cross sectional views of a substrate illustrating a method of forming a connection hole according to still another embodiment of the invention, wherein FIGS. 13 to 15 respectively correspond to a resist layer forming process, a resist developing process, and an insulating film forming and wiring forming process.
Figure 14:
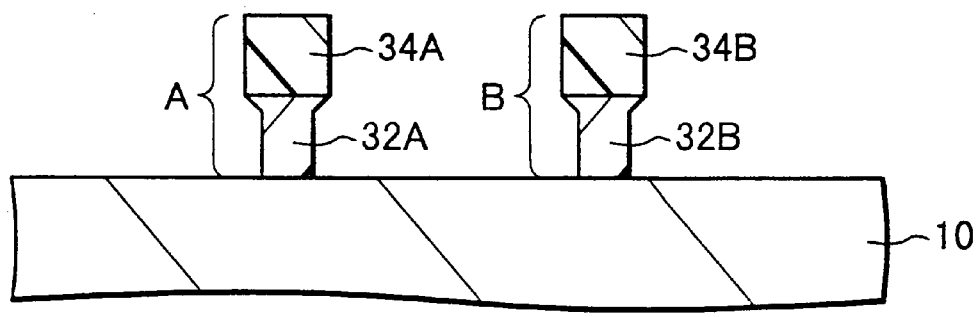
Figure 15:
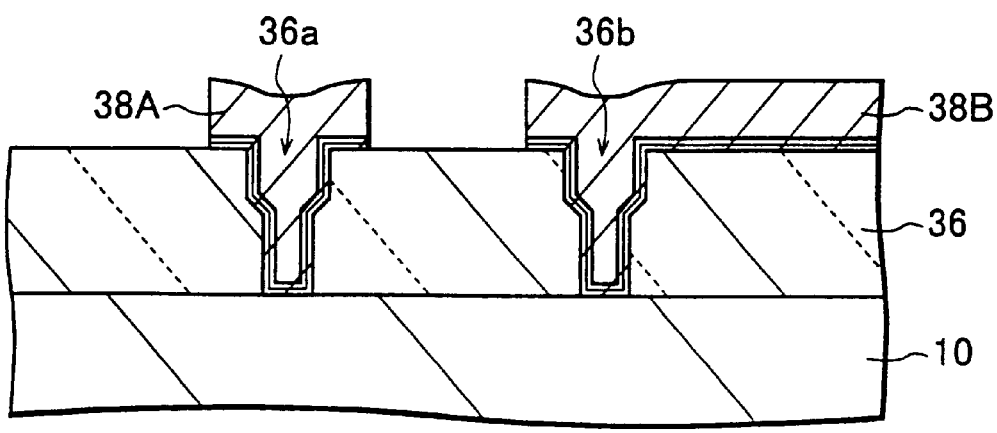

FIGS. 13 to 15 illustrate a method of forming a connection hole according to still another embodiment of the invention. The internal structure of the substrate 10 is omitted. A substrate similar to those shown in FIGS. 1 and 7 may be used.

In the process illustrated in FIG. 13, a resist layer 32 having large solubility against developer and a resist layer 34 having small solubility against developer are sequentially deposited on the surface of the substrate 10 by spin coating or the like. The thicknesses of he resist layers 32 and 34 may be set to 0.5 to 1.0 $\mu$m, for example 0.6 $\mu$m. When two resist layers having different solubilities are exposed and developed under the predetermined conditions, they show different response. In order to prevent mixture of materials of the resist layers 32 and 34 when they are coated, the high solubility lower resist layer 32 may be subjected to a curing process such as far ultraviolet radiation and baking before the formation of the low solubility upper resist layer 34, or different solvents may be used for the resist layers 32 and 34.

In the process illustrated in FIG. 14, the resist layers 32 and 34 are exposed and developed to leave on the substrate 10 resist lamination patterns (dummy patterns) A and B having shapes corresponding to a desired connection hole pattern. The aspect ratio of each resist lamination pattern A, B is about 1 to 2. The resist lamination A is a lamination of a fraction 32A of the resist layer 32 and a fraction 34A of the resist layer 34. The resist lamination B is a lamination of a fraction 32B of the resist layer 32 and a fraction 34B of the resist layer 34. Since a dissolution speed of the resist layer 32 when immersed in developing liquid is faster than that of the resist layer 34, both the resist laminations A and B have thinner lower portions than upper portions thereof. Thereafter, the processes similar to those described with FIGS. 3 to 6 are executed to form, as shown in FIG. 15, connection holes 36a and 36b corresponding to the removed resist laminations A and B in an SOG insulating film 36, and to form wiring patterns 38A and 38B on the insulating film 36, filling the connection holes 36a and 36b.

In the embodiment described with FIGS. 13 to 15, the advantageous effects similar to the embodiment described with FIGS. 1 to 6 can be obtained. In addition, the step coverage of the wiring patterns 38A and 38B can be improved because as shown in FIG. 15 the connection holes 36a and 36b have the upper portions larger than the lower portions.

In the embodiment of FIGS. 13 to 15, by increasing the number of resist types and the number of resist layers, connection holes having various shapes can be formed. For example, if a resist lamination is used which has three layers having high, middle, and low sensitivities in this order from the bottom layer, the shape of the opening of each connection hole 36a, 36b can be enlarged more smoothly from the bottom toward the top thereof.

Figure 16:
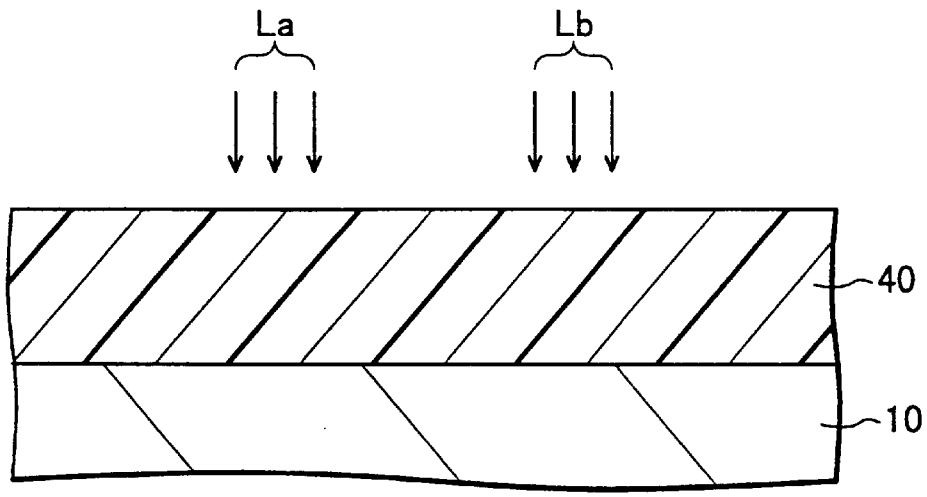
FIGS. 16 to 18 are cross sectional views of a substrate illustrating a method of forming a connection hole according to a further embodiment of the invention, wherein FIGS. 16 to 18 respectively correspond to a resist layer forming and resist exposing process, a resist developing process, and an insulating film forming and wiring forming process.
Figure 17:
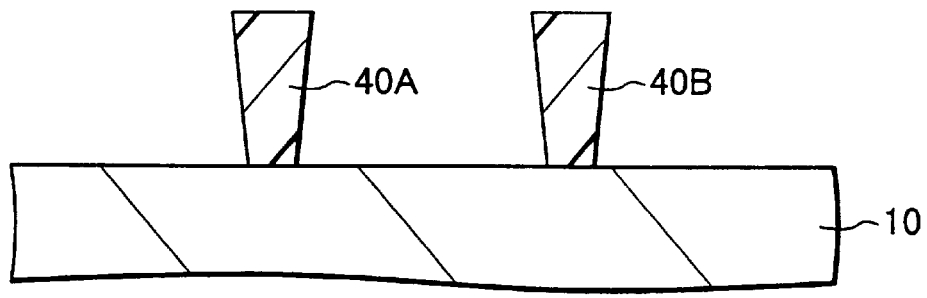
Figure 18:
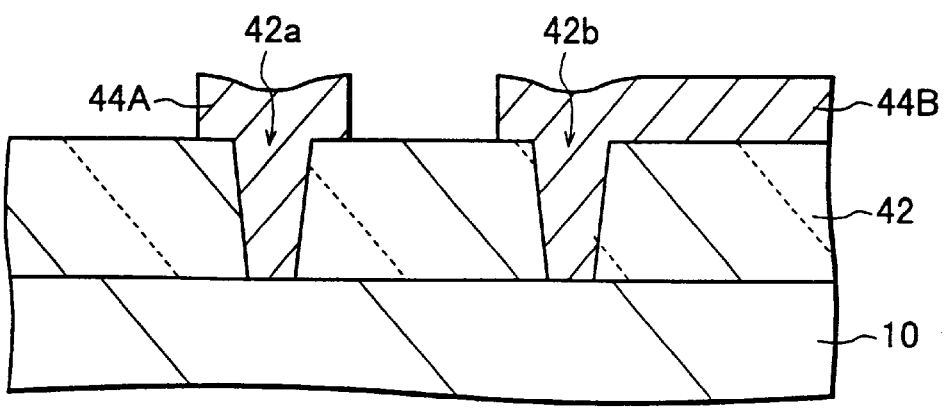
Figure 19:
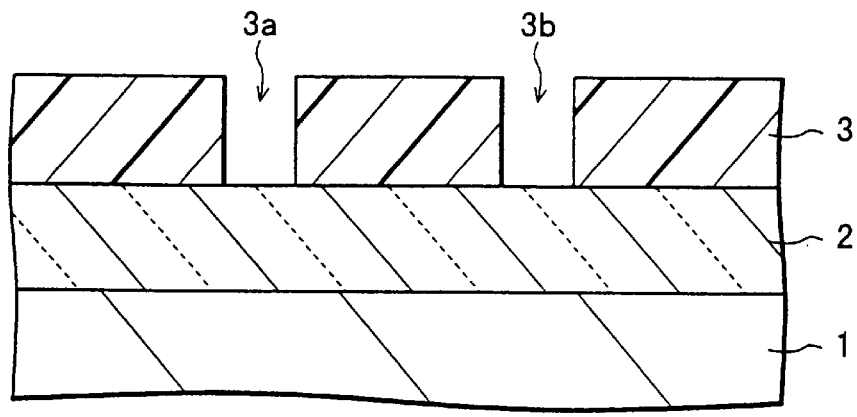
FIGS. 19 to 21 are cross sectional views of a substrate illustrating a conventional method of forming a connection hole, wherein FIGS. 19 to 21 respectively correspond to a resist developing process, a selective etching process, and a wiring forming process.
Figure 20:
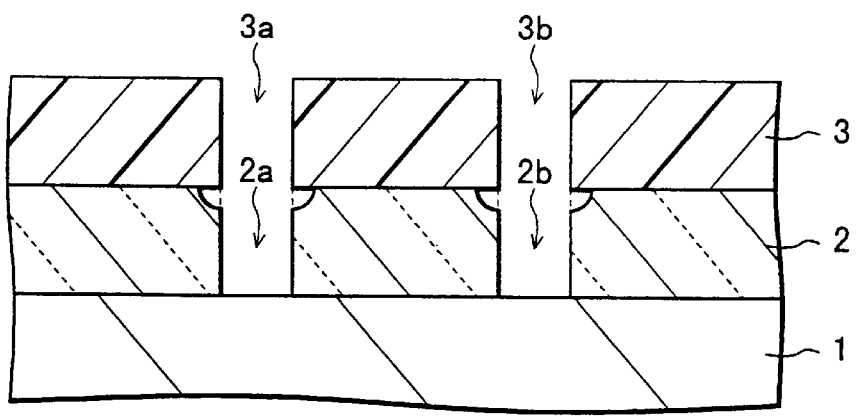
Figure 21:
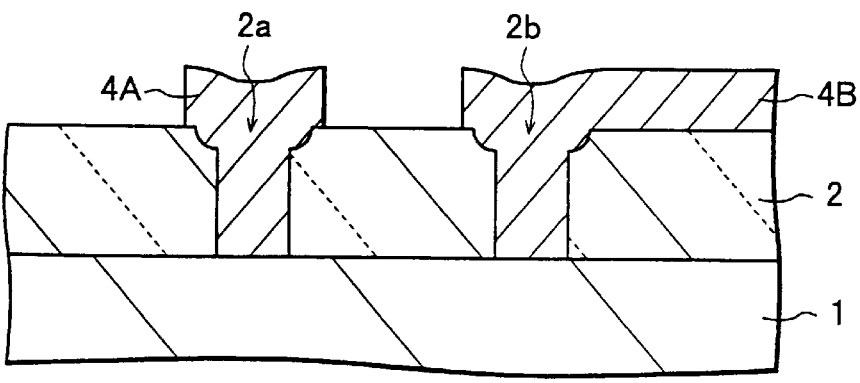

FIGS. 16 to 18 illustrate a method of forming a connection hole according to a further embodiment of the invention.

In the process illustrated in FIG. 16, a negative resist layer 40 of novolak-based resin or the like is formed on the surface of a substrate by spin coating or the like. Light beams La and Lb having a desired connection hole pattern are applied to the resist layer 40 to perform an exposure process.

In the process illustrated in FIG. 17, the resist layer is subjected to a development process to leave resist patterns (dummy pattern) 40A and 40B (parts of the resist layer 40) corresponding to the connection hole pattern. The exposed portion of the negative resist layer 40 remains unremoved during development. The exposure degree is lower at the deeper position because the incident light is gradually attenuated in the resist layer. As a result, the resist patterns 40A and 40B are thinned gradually from their upper portions toward the lower portions, forming a so-called negative taper or upside-down pyramid shape. Here, the term "(normal) taper" is defined as a shape which has a thinner cross-sectional width as the position goes upward. The term "negative taper" is defined as a shape which has a thicker cross-sectional width as the position goes upward.

Thereafter, the processes similar to those described with FIGS. 3 to 6 are executed to form, as shown in FIG. 18, connection holes 42a and 42b corresponding to the removed resist patterns 40A and 40B in an SOG insulating film 42, and to form wiring patterns 44A and 44B on the insulating film 42, filling the connection holes 42a and 42b.

In the embodiment described with FIGS. 16 to 18, the advantageous effects similar to the embodiment described with FIGS. 1 to 6 can be obtained. In addition, the step coverage of the wiring patterns 44A and 44B can be improved because as shown in FIG. 18 the connection holes 42a and 42b thickening from the lower portions toward the upper portions (the side wall of the connection hole forming a so-called normal taper or pyramid shape).

The resist pattern of a negative taper or upside-down pyramid shape shown in FIG. 17 may be formed by a known image reversal method. For example, a connection hole pattern is transferred to a positive resist layer by an exposure process similar to FIG. 16, and thereafter the positive resist layer is subject to a baking process in order to cause carboxylic acid to decarbonize. In this case, the dissolution speed during development is reversed at the exposed portion (corresponding to the connection hole) and an unexposed portion (corresponding to the area around the connection hole) of the positive resist layer. Thereafter, as the positive resist layer is developed, a negative pattern is obtained whose exposed portion remains unremoved and whose unexposed portion is dissolved. This negative pattern has the shape as shown in FIG. 17 because the dissolution speed gradually lowers from the lower portion toward the upper portion.

With the image reversal method, the positive resist layer is generally subjected to a whole surface exposure process after the baking process following the exposure, in order to form a resist pattern having its side wall perpendicular to the substrate surface. By omitting this whole surface exposure process, the resist pattern having the inverse taper or upside-down pyramid shape shown in FIG. 17 can be obtained. It is preferable to use i-line beam or excimer laser beam for the exposure process in order to form a resist pattern of an inverse taper or upside-down pyramid shape.

In the embodiment illustrated in FIGS. 7 to 12, if the SiN or polysilicon patterns 20A and 20B are dry etched in the process of FIG. 8 under the conditions that the negative taper or upside-down pyramid shape is formed, the normal taper or pyramid shape of the side wall of the connection hole 24a, 24b can be obtained in the process of FIG. 11. For the dry etching conditions which form the inverse taper shape, an over-etch is increased in a reactive ion etching (RIE) type dry etcher.

The invention is not limited only to the above embodiments. It is apparent that various modifications, improvements, combinations, and the like can be made by those skilled in the art. For example, the embodiment method is applicable not only to the formation of a first level wiring layer but also to a second level wiring layer and other layers. Different embodiment methods may be applied to first and second level wiring layers. The material of a dummy pattern may be any other suitable materials in addition to resist, SiN, and polysilicon.

I claim:

1. A method of manufacturing a wiring on a substrate, comprising the steps of:
    a) providing a substrate having a first area where the wiring is to be provided;
    b) forming a dummy pattern on the first area;
    c) forming an interlayer insulating layer over the substrate so as to cover the dummy pattern;
    d) flattening the interlayer insulating layer so as to expose an upper surface of the dummy pattern; and
    e) removing the dummy pattern from the exposed upper surface so as to provide a hole through the interlayer insulating layer.

2. A method according to claim 1, wherein the dummy pattern has a taper shape in which a bottom is narrower than a top.

3. A method according to claim 1, wherein the dummy pattern comprises a material selected from a group consisting of resist, silicon nitride and polysilicon.

4. A method according to claim 1, further comprising the step of:
    f) forming a wiring layer through the hole to contact the first area on the substrate.

5. A method of manufacturing a wiring on a substrate, comprising the steps of:
    a) providing a substrate having a contact area where the wiring is to be provided;
    b) forming a resist material on the first area;
    c) patterning the resist material to provide a dummy pattern;
    d) forming an interlayer insulating layer over the substrate so as to cover the dummy pattern;
    e) flattening the interlayer insulating layer so as to expose an upper surface of the dummy pattern; and
    f) removing the dummy pattern from the exposed upper surface so as to provide a hole through the interlayer insulating layer.

6. A method according to claim 5, wherein the resist material has two sublayers made of different resist.

7. A method according to claim 5, further comprising the step of:
    g) forming a wiring layer through the hole to contact the first area on the substrate.

* * * * *